United States Patent [19]
Yanaga et al.

[11] Patent Number: 5,375,077
[45] Date of Patent: Dec. 20, 1994

[54] DIGITAL SIGNAL PROCESSOR HAVING REDUCED BUS PRE-CHARGING OPERATIONS

[75] Inventors: Osamu Yanaga; Yasuyuki Okuaki, both of Tokyo, Japan

[73] Assignee: Oki Electric Industry Co., Ltd., Tokyo, Japan

[21] Appl. No.: 31,503

[22] Filed: Mar. 15, 1993

[30] Foreign Application Priority Data

Mar. 16, 1992 [JP] Japan ................................. 4-058228

[51] Int. Cl.⁵ ............................................ G06F 15/31
[52] U.S. Cl. ................................. 364/724.17; 364/707
[58] Field of Search .................... 364/724.17, 707, 736

[56] References Cited

U.S. PATENT DOCUMENTS

| | | | |
|---|---|---|---|
| 5,010,510 | 4/1991 | Nishimura et al. | 364/707 |
| 5,128,890 | 7/1992 | Girardeau, Jr. | 364/707 |
| 5,170,369 | 12/1992 | Rossum | 364/724.17 |
| 5,189,634 | 2/1993 | Eberle et al. | 364/724.17 |
| 5,241,492 | 8/1993 | Girardeau, Jr. | 364/736 |

FOREIGN PATENT DOCUMENTS 63-122309 5/1988 Japan .

*Primary Examiner*—David H. Malzahn
*Attorney, Agent, or Firm*—Spencer, Frank & Schneider

[57] ABSTRACT

A digital signal processor according to the present invention comprises a data bus, a control line for supplying a pre-charge signal at the beginning of each cycle, a first memory for providing a first data stored in a first address to the data bus at a first cycle, for receiving the first data from the data bus and storing the first data in a second address at a second cycle successively with the first cycle, a second memory for storing a second a data, an arithmetic circuit coupled to the data bus and the second memory, for receiving the first and second data at the first cycle, for performing arithmetic operation and producing a result data in response to the first data and second data at the second cycle, a pre-charge circuit for providing a potential to the data bus in response to the pre-charge signal, a pre-charge control circuit for transferring the pre-charge signal to the pre-charge circuit at the first cycle, and for inhibiting the transfer of the pre-charge signal at the second cycle. It is possible to provide a digital signal processor capable of operating at low power consumption with high integration.

13 Claims, 3 Drawing Sheets

DIGITAL SIGNAL PROCESSOR HAVING REDUCED BUS PRE-CHARGING OPERATIONS

CROSS REFERENCE TO A RELATED APPLICATION

This application claims priority benefits, under USC 35 119, of Japanese Patent Application No. 04-058228, filed Mar. 16, 1992, the entire disclosure of which is incorporated herein by reference.

BACKGROUND OF THE INVENTION

1. Field of the Invention

The present invention relates to a digital signal processor, particularly the digital signal processor capable of effectively performing a digital filtering operation.

2. Description of the Related Art

A digital signal processor has multipliers and adders which are respectively connected to one another wherein multiplication and addition can be performed at high speed. Data and coefficients to be operated on by the multiplier and the adder are respectively stored in a RAM (Random Access Memory) and a ROM (Read Only Memory). Generally, these memories are respectively incorporated into the digital signal processor or comprise semiconductor memories which are provided externally.

There is such a digital signal processor capable of performing a digital filtering operation as disclosed in Japanese Laid-Open Publication No. 63-122309, published on May 5, 1988.

SUMMARY OF THE INVENTION

It is an object of the present invention to provide a digital signal processor capable of operating at low power consumption with high integration.

In order to achieve the above object, the digital signal processor according to the present invention comprises a data bus, a control line for supplying a pre-charge signal at the beginning of each cycle, a first memory for providing a first data stored in a first address to the data bus at a first cycle and for receiving the first data from the data bus and storing the first data in a second address at a second cycle successively with the first cycle, a second memory for storing a second data, an arithmetic circuit coupled to the data bus and the second memory, for receiving the first and second data at the first cycle, for performing arithmetic operation and producing a result data in response to the first data and second data at the second cycle, a pre-charge circuit for providing a potential to the data bus in response to the pre-charge signal, a pre-charge control circuit for transferring the pre-charge signal to the pre-charge circuit at the first cycle, and for inhibiting the transfer of the pre-charge signal at the second cycle.

With the arrangement of the preferred embodiment of the present invention, a pre-charge circuit is controlled by a pre-charge control circuit. Accordingly, in case of realizing an arithmetic process of a secondary infinite response filter (hereinafter referred to as an IIR filter), the number of pre-charging operations of a data bus can be reduced. Since the data bus usually comprises more than 16 bits, the wiring of the data bus is very long. If the data bus is pre-charged every operation cycles, power consumption is greatly increased. Accordingly, if the number of pre-charging operations of the data bus is reduced, the power consumption is effectively reduced.

Furthermore, during the term when the data bus is prevented from being pre-charged, the data which was read in the immediately preceding operation cycle remains held on the data bus. Accordingly, it is not necessary to provide a register which temporarily stores the data. It is a matter of course that the larger the number of bits of data that there are the larger such a register is. According to the present invention, the digital signal processor can be highly integrated since it can dispense with such a register which temporarily stores the data.

Still furthermore, according to the present invention, it is possible to provide a digital signal processor capable of operating at low power consumption with high integration.

BRIEF DESCRIPTION OF THE DRAWINGS

The above and other objects and features of the invention will be apparent to those skilled in the art from the following detailed description of a preferred embodiment of the invention, when considered with the accompanied drawings in which.

DETAILED DESCRIPTION OF THE PREFERRED EMBODIMENTS

Figure 1:
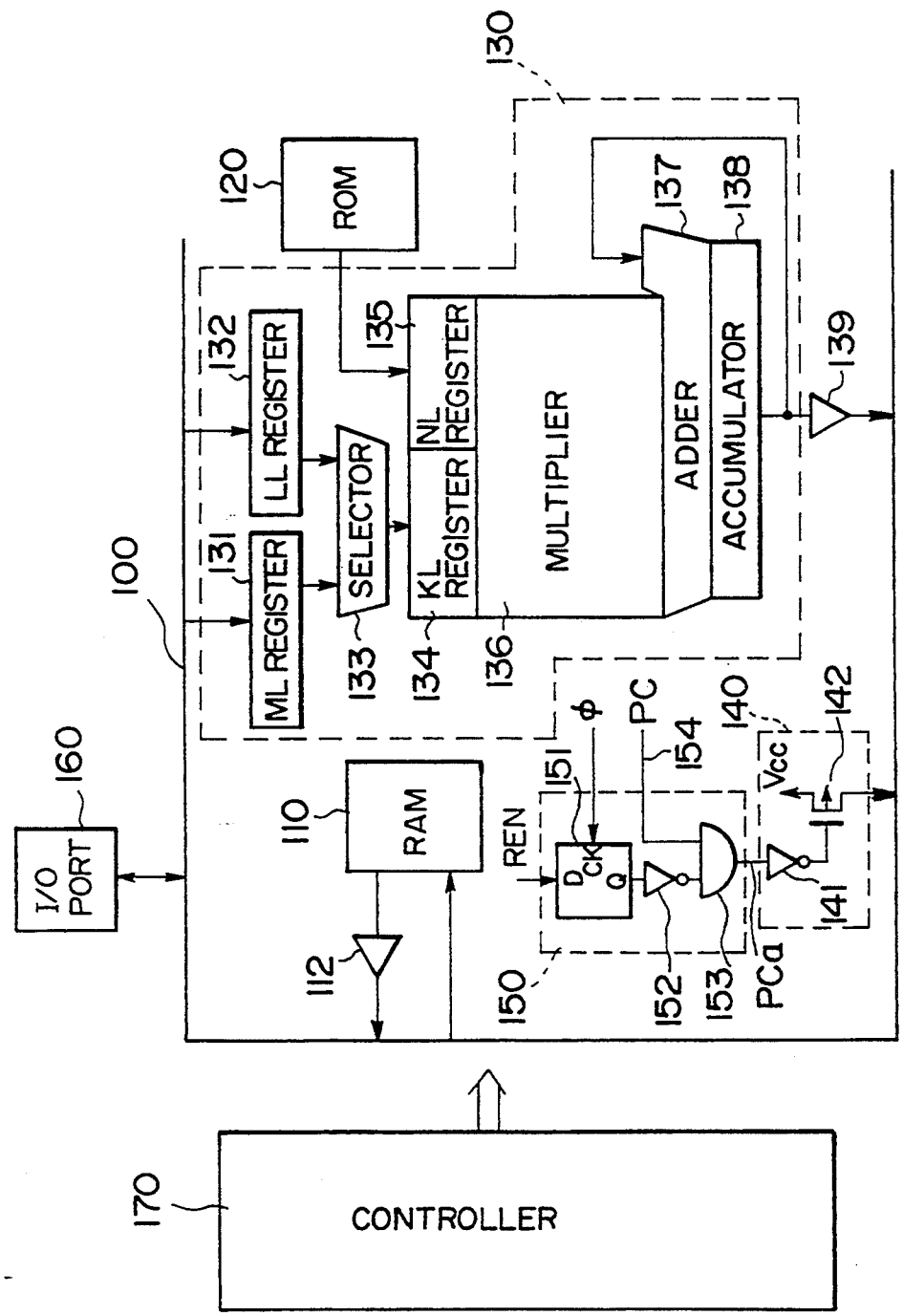
FIG. 1 is a functional block diagram of a digital signal processor according to a preferred embodiment of the present invention.

A preferred embodiment of the present invention will be described with reference to FIGS. 1 to 3 in which FIG. 1 shows the functional block diagram of the digital signal processor of the present invention.

The digital signal processor comprises a data bus 100 for performing the transfer of data, a first data memory (a RAM 110 in this embodiment) for storing therein data on the data bus 100, a second data memory (a ROM 120 in this embodiment) for storing therein a filter coefficient, an operation portion 130 for performing an operation based on data which is supplied from the RAM 110 and the ROM 120, a pre-charge circuit 140 for pre-charging the data bus 100, a pre-charge control circuit 150 for controlling the pre-charge circuit 140, an input-output port (hereinafter referred to as I/O PORT) 160 and a controller 170.

The RAM 110 is connected to the data bus 100 at the input portion thereof and to the same data bus 100 at the output portion thereof through a driver circuit 112.

The operation portion 130 comprises an ML register 131 and an LL register 132 for receiving the data on the data bus 100 and storing the same data therein, a selector 133 for receiving the data stored in the ML register 131 and the LL register 132 and selecting and outputting either of the data stored in the ML register 131 or LL register 132, a KL register 134 for receiving the data which is output from the selector 133, an NL register 135 for receiving the data from the ROM 120, a multiplier 136 for performing a multiplication by applying the data which is output from the KL register 134 by the data which is output from the NL register 135, an adder 137 for performing an addition by adding the data which is the result of the multiplication (hereinafter referred to as a product) and the data which is fed back from an accumulator (hereinafter referred to as ACC)

138 and the ACC 138 for storing the data which is the result of the addition (hereinafter referred to as a sum).

The output of the ACC 138 is connected to the data bus 100 through a driver circuit 139 and is fed back to the input of the adder 137. In this case, the adder 137 performs the addition by adding the data of the product performed in the multiplier 136 and the data which is fed back from the ACC 138 and outputs the data of the sum to the ACC 138. The ACC 138 stores therein the same data of the sum. The data thus stored in the ACC 138 is output to the data bus 100 through the driver circuit 139. The adder 137 may comprise an arithmetic logic unit (ALU).

The pre-charge circuit 140 responds to a pre-charge control signal PCa which is output from the pre-charge control circuit 150 and pre-charges the data bus 100. The data bus 100 performs the transfer of the data after it is pre-charged. The pre-charge circuit 140 comprises an inverter 141 having an input to which a pre-charge control signal PCa is input and a P-channel type MOS transistor (hereinafter referred to as a PMOS) 142 having a gate electrode which is controlled by the output of the inverter 141. The PMOS 142 has a source electrode which is connected to a power supply Vcc having a power supply potential level and a drain electrode which is connected to the data bus 100.

The pre-charge control circuit 150 comprises a delay type flip-flop (hereinafter referred to as a D-FF) 151, an inverter 152 and an AND gate electrode 153. The D-FF 151 can latch a register enable signal REN upon reception of a clock pulse $\phi$. The output of the D-FF 151 is connected to the input of the inverter 152. The input of the AND gate electrode 153 is connected to the output of the inverter 152 and a pre-charge signal supply line 154 through which a pre-charge signal PC is supplied to the AND gate electrode 153. The AND gate electrode 153 outputs the pre-charge control signal PCa. The register enable signal REN is supplied to the D-FF 151 in a given operation cycle. The clock pulse $\phi$ and the pre-charge signal PC are supplied in every operation cycle. The timing when the pre-charge control signal PCa is output, i.e. the timing when the data bus 100 is pre-charged is determined by the timing when the register enable signal REN, the clock pulse $\phi$ and the pre-charge signal PC are supplied to the pre-charge control circuit 150.

The digital signal processor having the arrangement as set forth above can be used in an IIR filter. The operation of the IIR filter will be described with reference to FIG. 2 showing the functional block diagram of the IIR filter.

The IIR filter is a filter wherein the impulse response continues infinitely in a linear digital filter. The IIR filter includes adder means 201, 202, 203 and 204 which sequentially add an input data IN from, for example, data bus 100. An output data OUT is output from the last stage of adder means 204. The additions which are performed by the adder means 201 to 204 are performed by the adder 137 as illustrated in FIG. 1. The output of the adder means 202 is connected to delay means 211 and 212. The delay generated by the delay means 211 and 212 can be realized using an n address and n+1 address, respectively, of the RAM 110 as illustrated in FIG. 1. The outputs of the delay means 211 and 212 are respectively connected to inputs of the adder means 201 to 204 through multiplier means 221 to 224. The multiplications which are performed by the multiplier means 221 to 224 by multiplying the outputs of the delay means 211 and 212 by the filter coefficient (meaning multiplier), which is stored in the ROM 120 as illustrated in FIG. 1, are performed by the multiplier 136 in FIG. 1. The notations at n and n+1 as indicated in the delay means 211 and 212 in FIG. 2 represent addresses of the RAM 110, while the notations at n, n+1, n+2 and n+3 as indicated under the multiplier means 221 to 224, represent addresses of the ROM 120.

Figure 3:
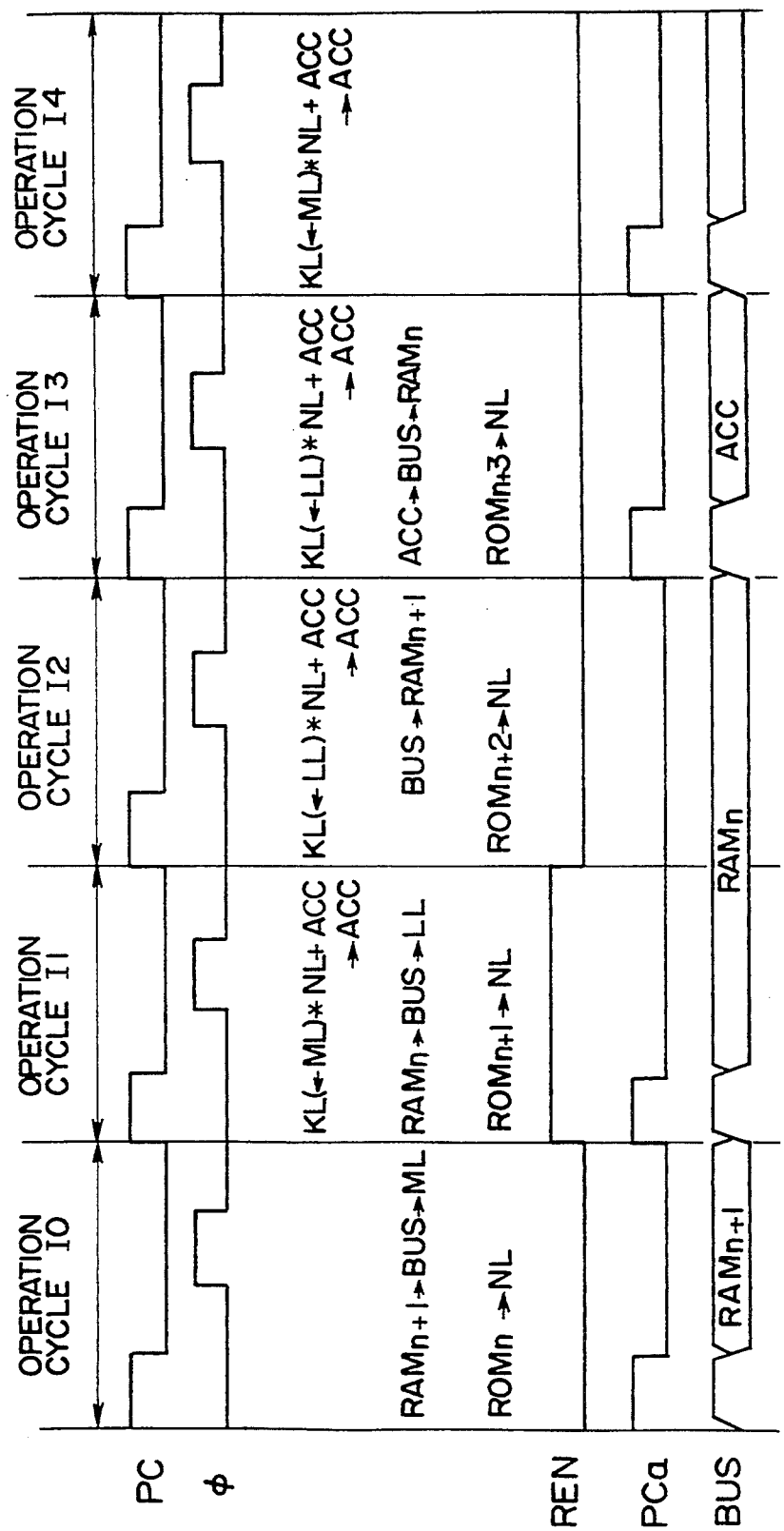
FIG. 3 is a time chart showing an operation of the digital signal processor in FIG. 1.

The detailed operation of the IIR filter will be described with reference to the time chart as illustrated in FIG. 3.

In FIG. 3, the notations at "I0 to I4" represent operation cycles, "BUS" represents the data bus 100, and "ML", "LL", "KL", "NL" represent the ML register 131, the LL register 132, the KL register 134 and NL register 135, respectively. The notations at "ACC" represents an accumulator 138 and "RAM$_n$" and "RAM$_{n+1}$" represent the data stored in the addresses n and n+1, respectively of the RAM 110, while "ROM$_n$" and "ROM$_{n+1}$", "ROM$_{n+2}$" and "ROM$_{n+3}$" represent the data stored in the addresses n, n+1, n+2 and n+3 of the ROM 120, respectively.

In the "Operation Cycle I0", the data RAM$_{n+1}$ which is stored in the address n+1 of the RAM 110 is transferred onto the data bus 100 and is input to the ML register 131. At the same time, the data ROM$_n$ which is stored in the address n of the ROM 120 is input to the NL register 135.

Subsequently in the "Operation Cycle I1", the data which is stored in the ML register 131 is input to the KL register 134 through the selector 133. The multiplier 136 performs the multiplication by multiplying the data which is output from the KL register 134 by the data which is output from the NL register 135 and outputs the product thereof to the adder 137. The adder 137 performs the addition by adding the same product and the data which is fed back from the ACC 138 and outputs the sum to the ACC 138. The ACC 138 stores therein the data of the sum thereof. A sequence of these arithmetic processes correspond to the operations which are performed by the multiplier means 221 and the adder means 201 as illustrated in FIG. 2. The data RAM n which is stored in the address n of the RAM 110 is transferred onto tile data bus 100 and is input to the LL register 132. At the same time, the data ROM$_{n+1}$ which is stored in the address n+1 of the ROM 120 is input to the NL register 135. The register enable signal REN is latched in the D-FF 151 when the latter receives the clock pulse $\phi$ so that the data bus 100 is prevented from being pre-charged in the next "Operation Cycle I2". That is, the pre-charge circuit 140 is restrained from pre-charging the data bus 100 while the pre-charge control signal PCa which is supplied from the pre-charge control circuit 150 to the pre-charge circuit 140 remains held at "Low" level in the next "Operation Cycle I2".

In the "Operation Cycle I2", the data which is stored in the LL register 132 is input to the KL register 134 through the selector 133. The multiplier 136 performs the multiplication by multiplying the data which is output from the KL register 134 by the data which is output from the NL register 135 and outputs the product thereof to the adder 137. The adder 137 performs the addition by adding the data of the same product and the data which is fed back from the ACC 138 and outputs the sum thereof to the ACC 138. The ACC 138 stores therein the data of the sum. A sequence of these arithmetic processes correspond to the operations which are performed by the multiplier means 222 and the adder means 202 as illustrated in FIG. 2. Furthermore, the data RAM $_n$ which remains held on the data bus 100 is stored in the address n+1 of the RAM 110 since the data bus 100 is prevented from being pre-charged in the "Operation Cycle I1". This process corresponds to the transfer operation of the data from the delay means 211 to the delay means 212 as illustrated in FIG. 2.

The restraint of the pre-charging operation of the pre-charge circuit 140 will be described hereinafter.

The high-level register enable signal REN which is latched in the D-FF 151 is output from the D-FF 151 when the clock pulse $\phi$ is supplied to the D-FF 151 in the "Operation Cycle I1". The register enable signal REN is inverted by the inverter 152 and is supplied to the AND gate electrode 153 as an inverted signal. The inverted signal and the pre-charge signal PC are ANDed by the AND gate electrode 153. Accordingly, the output of the AND gate electrode 153, i.e. the pre-charge control signal PCa is changed to a "Low" level. The pre-charge control signal PCa is inverted by the inverter 141. The PMOS 142 is turned off by the inverted signal. Accordingly, the data bus is prevented from being pre-charged. As a result, the data RAM $_n$ which is read in the "Operation Cycle I1" remains held as it is on the data bus 100. The thus held data RAM$_n$ is stored in the address n+1 of the RAM 110 in the "Operation Cycle I2". This process corresponds to the transfer operation of the data from the delay means 211 to the delay means 212 as illustrated in FIG. 2. At the same time, the data ROM$_{n+2}$ which is stored in the address n+2 of the ROM 120 is input to the NL register 135.

Subsequently in the "Operation Cycle I3", the data which is stored in the LL register 132 is input to the KL register 134 through the selector 133. The multiplier 136 performs the multiplication by multiplying the data which is output from the KL register 134 by the data which is output from the NL register 135 and outputs the product thereof to the adder 137. The adder 137 performs the addition by adding the data of the same product and the data which is fed back from the ACC 138 and outputs the sum thereof to the ACC 138. The ACC 138 stores therein the data of the sum. A sequence of these arithmetic processes correspond to the operations which are performed by the multiplier means 223 and the adder means 203 as illustrated in FIG. 2. At the same time, the data which is stored in the ACC 138 in the "Operation Cycle I2" is transferred onto the data bus 100 and is then stored in the address n of the RAM 110 and is also input to the ML register 131. This process corresponds to the transfer operation of the data from the adder means 202 to the delay means 211 as illustrated in FIG. 2. At the same time, the data ROM$_{n+3}$ which is stored in the address n+3 of the ROM 120 is input to the NL register 135.

Subsequently in the "Operation Cycle I4", the data which is stored in the ML register 131 is input to the KL register 134 through the selector 133. The multiplier 136 performs the multiplication by multiplying the data which is output from the KL register 134 by the data which is output from the NL register 135 and outputs the product thereof to the adder 137. The adder 137 performs the addition by adding the data of the product and the data which is fed back from the ACC 138 and outputs the sum thereof to the ACC 138. The ACC 138 stores therein the data of the same sum. A sequence of these arithmetic processes correspond to the operations which are performed by the multiplier means 224 and the adder means 204 as illustrated in FIG. 2. One arithmetic operation cycle of the IIR filter is completed by performing the Operation Cycles I0 to I4.

Figure 2:
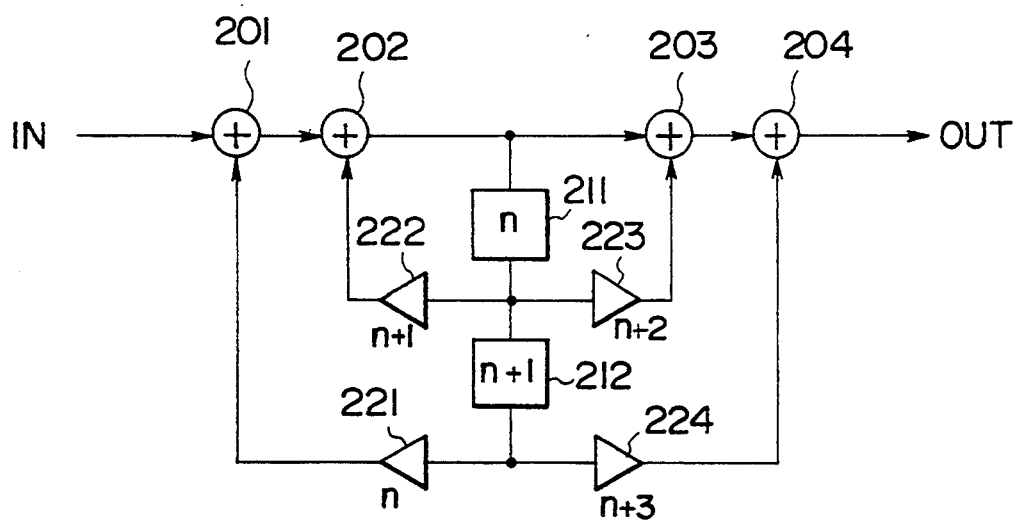
FIG. 2 is functional block diagram illustrating an IIR filter.

The result of operation as performed in the manner as set forth above (corresponding to the output OUT as illustrated in FIG. 2) is transferred from the ACC 138 onto the data bus 100 through the driver circuit 139 and is output to the I/O port 160.

In case of connecting the IIR filter as illustrated in FIG. 2 are connected in multiple stages in series to the output OUT, the process which is performed in the Operation Cycle I4 as illustrated in FIG. 3 and an Operation Cycle I0 of the IIR filter of the next stage can be realized by one operation cycle. Accordingly, the arithmetic process of one IIR filter can be performed within four operation cycles.

With the arrangement of the preferred embodiment of the present invention, the pre-charge circuit is controlled by the pre-charge control circuit. Accordingly, in case of realizing the arithmetic process of the IIR filter as set forth above, it is possible to reduce the number of pre-charging operations of the data bus. Since the data bus usually comprises more than 16 bits, the wiring of the data bus is very long. If the data bus is pre-charged every operation cycle power consumption is greatly increased. Accordingly, if the number of pre-charging operations of the data bus is reduced, the power consumption is effectively reduced.

Furthermore, during the cycle when the data bus is prevented from being pre-charged, the data which was read in the immediately preceding operation cycle remains held on the data bus. Accordingly, it is not necessary to provide a register which temporarily stores the data. It is a matter of course that the larger the number of bits of data that there are, the larger such a register is. According to the present invention, the digital signal processor can be highly integrated since it can dispense with such a register which temporarily stores the data.

Still furthermore, according to the present invention, it is possible to provide the digital signal processor capable of operating at low power consumption with high integration.

While the present invention has been described with reference to the illustrative embodiment, this description is not intended to be construed in a limiting sense. Various modifications of the illustrative embodiment, as well as other embodiments of the invention, will be apparent to persons skilled in the art upon reference to this description. It is therefore contemplated that the appended claims will cover any such modification or embodiments as fall within the true scope of the invention.

What is claimed is:

1. A digital signal processor comprising:
   a data bus;
   a control line for supplying a pre-charging signal at the beginning of each cycle;
   a first memory for providing a first data stored in a first address to the data bus during a first cycle, for receiving the first data from the data bus and storing the first data in a second address during a second cycle, the second cycle being successive to the first cycle;
   a second memory for storing a second data;
   an arithmetic circuit, coupled to the data bus and the second memory, for receiving the first and second data during the first cycle, for performing an arithmetic operation and producing a result data in response to the first data and second data during the second cycle;
a pre-charge circuit for providing a potential to the data bus in response to the pre-charge signal; and
a pre-charge control circuit for transferring the pre-charge signal to the pre-charge circuit during the first cycle, and for inhibiting the transfer of the pre-charge signal to the pre-charge circuit during the second cycle.

2. The digital signal processor according to claim 1, wherein the pre-charge control circuit comprises:
a latching circuit for outputting a first signal and a second signal; and
a gate circuit for transferring the pre-charge signal to the pre-charge circuit in response to the first signal, and for inhibiting the transfer of the pre-charge signal to the pre-charge circuit in response to the second signal.

3. A digital signal processor comprising:
a data bus;
a control line for supplying a pre-charge signal at a beginning of each cycle;
a memory for providing a data to the data bus during a first cycle;
a register, coupled to the data bus, for receiving the data during the first cycle;
a pre-charge circuit for providing a potential to the data bus in response to the pre-charge signal; and
a pre-charge control circuit for transferring the pre-charge signal to the pre-charge circuit during the first cycle, and for inhibiting transfer of the pre-charge signal to the pre-charge circuit during a second cycle, the second cycle being successive to the first cycle.

4. The digital signal processor according to claim 3, wherein the pre-charge control circuit comprises:
a latching circuit for outputting a first signal and a second signal; and
a gate circuit for transferring the pre-charge signal to the pre-charge circuit in response to the first signal, and for inhibiting transfer of the pre-charge signal to the pre-charge circuit in response to the second signal.

5. A digital signal processor comprising:
a data bus;
a control line for supplying a pre-charge signal at a beginning of each cycle;
a RAM for providing a first data during a first cycle, and for receiving the first data from the data bus during a second cycle, the second cycle being successive to the first cycle;
a ROM for storing a second data;
an arithmetic circuit, coupled to the data bus and the ROM, for receiving the first and second data during the first cycle, for performing an arithmetic operation and producing a result data in response to the first data and second data during the second cycle;
a transistor, having a first electrode, for coupling the data bus to a power supply having a predetermined potential in response to the pre-charge signal, the pre-charge signal being applied to the first electrode; and
a pre-charge control circuit for transferring the pre-charge signal to the transistor during the first cycle, and for inhibiting transfer of the pre-charge signal to the transistor during the second cycle.

6. The digital signal processor according to claim 5, wherein the pre-charge control circuit comprises:
a latching circuit for outputting a first signal and a second signal; and
a gate circuit for transferring the pre-charge signal to the transistor in response to the first signal, and for inhibiting transfer of the pre-charge signal to the transistor in response to the second signal.

7. A digital signal processor comprising:
a data bus;
a control line for supplying a pre-charge signal at a beginning of each cycle;
a memory for providing a data to the data bus during a first cycle;
a register, coupled to the data bus, for receiving the data during the first cycle;
a pre-charge control circuit for outputting a control signal in response to the pre-charge signal, the control signal having a first logic level and a second logic level; and
a pre-charge circuit for providing a predetermined potential to the data bus when the control signal is at the first logic level during the first cycle, and preventing the predetermined potential from being provided to the data bus when the control signal is at the second logic level during a second cycle, the second cycle being successively to the first cycle.

8. The digital signal processor according to claim 7, wherein the pre-charge circuit comprises a transistor having a first electrode, a second electrode and a third electrodes, and
wherein the control signal is applied to the first electrode, the second electrode is coupled to a power supply having the predetermined potential, and the third electrode is coupled to the data bus.

9. The digital signal processor according to claim 8, wherein the transistor is an MOS transistor.

10. A digital signal processor comprising:
a data bus;
a control line for supplying a pre-charge signal at a beginning of each cycle;
a memory for providing a data to the data bus during a first cycle;
a register, coupled to the data bus, for receiving the data during the first cycle;
a pre-charge control circuit for outputting a first control signal during the first cycle in response to the pre-charge signal and to an enable signal when the enable signal has a first logic level, and outputting a second control signal during the second cycle in response to the enable signal when the enable signal has a second logic level, the second cycle being successive to the first cycle; and
a pre-charge circuit for providing a predetermined potential to the data bus in response to the first control signal and preventing the predetermined potential from being providing to the data bus in response to the second control signal.

11. The digital signal processor according to claim 10, wherein the pre-charge circuit couples a power supply having the predetermined potential to the data bus in response to the first control signal, and in response to the second control signal, the pre-charge circuit uncouples the power supply from the data bus.

12. The digital signal processor according to claim 11, wherein the pre-charge circuit comprises a transistor having a first electrode, a second electrode and a third electrode, and
wherein, the first and second control signals are applied to the first electrode, the second electrode is coupled to the power supply, and the third electrode is coupled to the data bus.

13. The digital signal processor according to claim 12, wherein the transistor is an MOS transistor.

* * * * *